United States Patent [19]
Grohgans et al.

[11] Patent Number: 5,940,747
[45] Date of Patent: Aug. 17, 1999

[54] APPARATUS AND METHOD OF ACQUIRING A CARRIER SIGNAL IN A WIRELESS RECEIVER

[75] Inventors: Matthew Grohgans, Beachwood; Jahangir Mohammed, Edison, both of N.J.

[73] Assignee: Lucent Technologies, Inc., Murray Hill, N.J.

[21] Appl. No.: 08/825,239

[22] Filed: Mar. 27, 1997

[51] Int. Cl.⁶ .................................................. H04B 1/16
[52] U.S. Cl. ................................. 455/168.1; 455/161.2; 455/180.3; 455/324
[58] Field of Search ................................ 455/75, 76, 77, 455/150.1, 161.2, 164.1, 164.2, 168.1, 169.1, 173.1, 175.1, 176.1, 177.1, 180.3, 182.2, 182.3, 183.1, 183.2, 192.1, 192.2, 192.3, 324, 186.1

[56] References Cited

U.S. PATENT DOCUMENTS

| | | | |
|---|---|---|---|
| 5,301,366 | 4/1994 | Groshong et al. | 455/192.3 |
| 5,450,621 | 9/1995 | Kianush et al. | 455/182.3 |
| 5,457,816 | 10/1995 | Koyama | 455/186.1 |
| 5,542,095 | 7/1996 | Petranovich | 455/183.2 |
| 5,751,772 | 5/1998 | Mannette et al. | 455/168.1 |

*Primary Examiner*—Reinhard J. Eisenzopf
*Assistant Examiner*—Lester G. Kincaid

[57] ABSTRACT

An apparatus and method performs a carrier signal acquisition operation in a receiver of a wireless portable unit. In order to locate and lock onto a carrier signal, a processor in the receiver is configured to sequentially examine each of a plurality of designated frequency bands within a predetermined frequency range, starting with the frequency band having the highest probability of containing the carrier signal. Through this acquisition operation, the carrier signal is easily located when outside of the normal search range of the processor. Since frequency errors due to, for example, the effects of variation and aging of hardware circuits are easily corrected, an inexpensive temperature compensated crystal oscillator may be employed in the receiver of the portable unit. In addition, since the processor is required to search only over a relatively narrow frequency band at any given point in time, a processor that requires a small number of instructions per second and minimal memory also may be employed in the receiver of the portable unit.

25 Claims, 4 Drawing Sheets

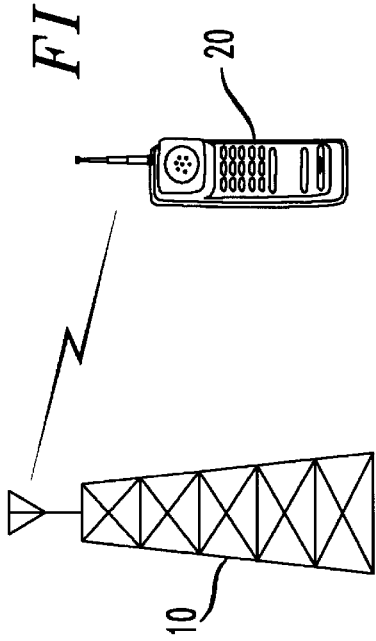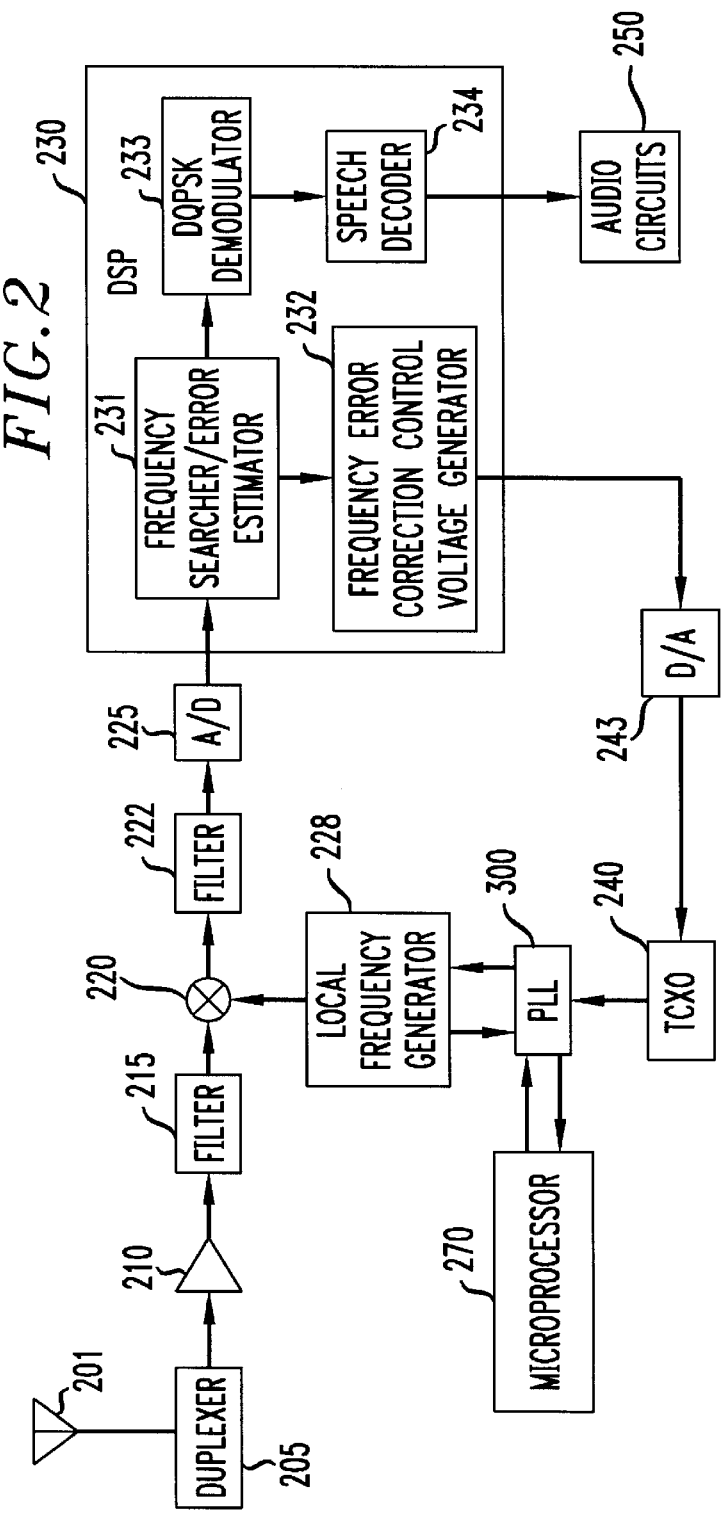

& # x 2 0 ;
APPARATUS AND METHOD OF ACQUIRING A CARRIER SIGNAL IN A WIRELESS RECEIVER

TECHNICAL FIELD

This invention relates to wireless receivers and, more particularly, to a receiver which acquires a carrier signal from within a range of frequencies.

BACKGROUND OF THE INVENTION

Wireless receivers, such as those employed in a cellular communication system, have the capability of tuning to and locking onto a carrier signal generated by a remotely located transmitter for decoding information modulated onto this carrier signal. In a typical cellular communication system, both a processor and a local frequency generator are employed for acquiring the carrier signal. Traditional carrier signal acquisition algorithms used in processors, such as digital signal processors, cannot reliably configure these processors for acquiring the carrier signal if the frequency of the local signal generator differs appreciably from the frequency of the carrier signal. An accurate local signal generator is therefore required for optimum receiver performance. For providing the desired accuracy, a highly-stable temperature compensated crystal oscillator is usually employed as a signal source in this type of receiver. Unfortunately, highly-stable temperature compensated crystal oscillators are expensive components. And in a portable unit, where the goal is to manufacture these units in as economical manner as possible, the cost of each component included in the unit is carefully considered. It is therefore desirable to be able to use a less expensive, albeit less stable, temperature compensated crystal oscillator in order to contribute to the reduction in the overall cost of the portable unit.

SUMMARY

In accordance with the invention, the above problem is resolved through use of an apparatus and method for performing a carrier signal acquisition operation in a portable unit. In order to locate and lock onto a carrier signal on a particular frequency channel, a processor in the portable unit is configured to sequentially examine each of a plurality of designated frequency bands within a given frequency range, starting with the frequency band having the highest probability of containing the carrier signal. Through this acquisition operation, the carrier signal may therefore be easily located when outside of the normal search range of the processor. Since frequency errors due to, for example, the effects of variation and aging of hardware circuits are easily corrected, an inexpensive temperature compensated crystal oscillator may be initially employed in the receiver of the portable unit. In addition, since the processor is required to search only over a relatively narrow frequency band at any given point in time, a processor that requires a small number of instructions per second and minimal memory also may be employed in the receiver of the portable unit.

BRIEF DESCRIPTION OF THE DRAWINGS

The invention and its mode of operation will be more clearly understood from the following detailed description when read with the appended drawing in which:

FIG. 1 is an illustration of a portable unit which communicates with a base station in a communication system;

FIG. 2 is a block diagram of certain receiver circuit sections of the portable unit of FIG. 1 that are used in receiving and demodulating a signal received from a base station;

Throughout the drawing, the same element when shown in more than one figure is designated by the same reference numeral.

DETAILED DESCRIPTION

Figure 3:
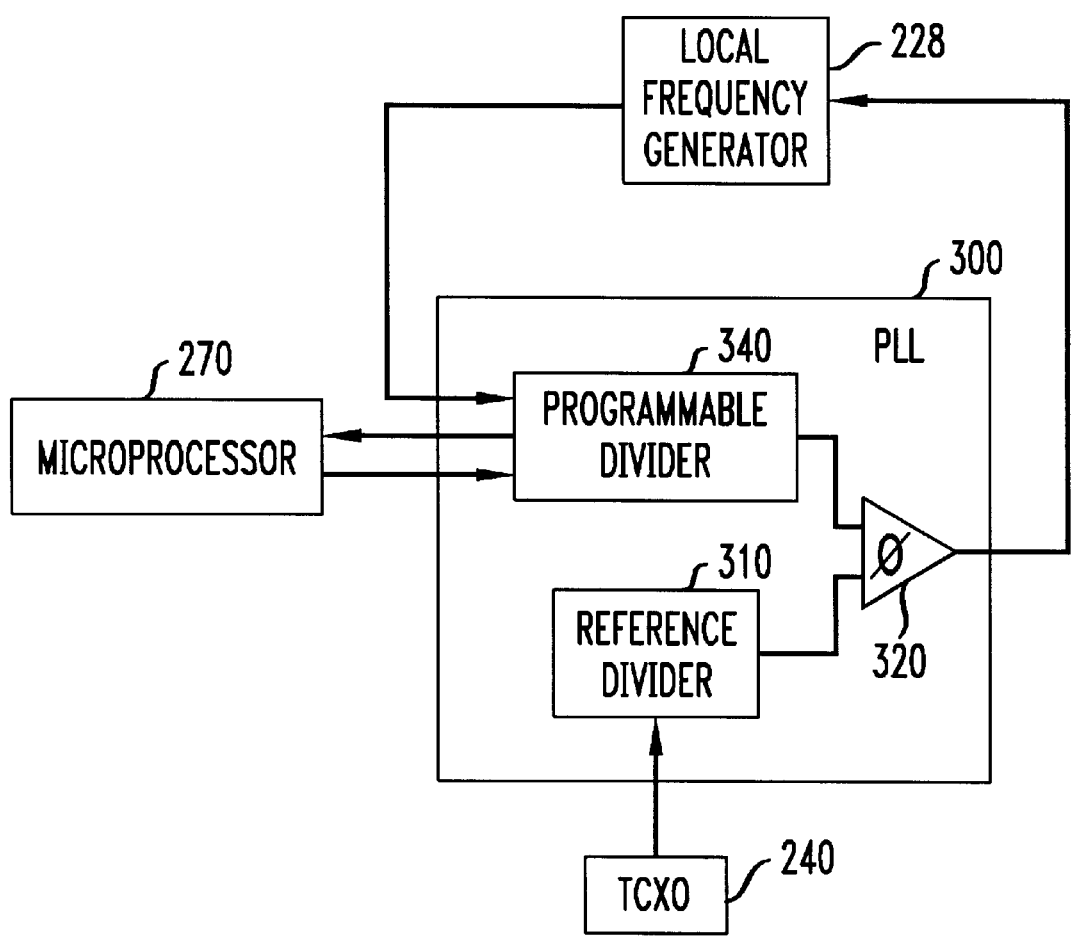
FIG. 3 is a block diagram of a phase locked loop suitable for use in the receiver circuit sections of the portable unit shown in FIG. 2.

Referring now to FIG. 1, there is shown a base station 10 and a portable unit 20 between which wireless communications is provided over a communication channel in, for example, a cellular network. The base station 10 communicates with the portable unit 20 while the user of this portable unit is located within a geographical boundary of an associated cell in which radio coverage is provided by the base station. The cellular concept is well known and is described in general in the *Bell System Technical Journal*, Volume 58, Number 1, January 1979, and specifically in an article entitled *The Cellular Concept* by V. H. MacDonald, on pages 15 through 41 of this journal. This concept describes an analog system that is sometimes referred to as AMPS (Advanced Mobile Phone Service) and has been standardized in a number of Telecommunications Industry Association (TIA) standards, for example, TR-45.1.

Referring next to FIG. 2, there is shown a block diagram depicting certain selected portions of the portable unit 20 which are suitable for use, in accordance with the disclosed embodiment, for acquiring a carrier signal in a wireless receiver. As illustrated, the block diagram shows circuitry that is suitable for operation in a time division multiple access (TDMA) cellular system as defined in the TIA North American IS-54/IS-136 Air Interface Standard. An example of a cellular telephone terminal suitable for use as portable unit 20 is AT&T Cellular Telephone Model 6650 available from Lucent Technologies Inc. The receiver circuitry shown in FIG. 2 is similarly suitable for use in other cellular systems such as, by way of example, the analog system described herein above, a code division multiple access (CDMA) system, as described in the TIA North American IS-95/J008 Air Interface Standard or the global system for mobile communication (GSM) standard.

The functions of this circuitry are described by way of illustrating their operation in acquiring a carrier signal. An RF carrier signal is received by antenna 201 and coupled to an RF amplifier 210. From this amplifier 210, the carrier signal is coupled to an RF filter 215 where any noise outside of the cellular radio frequency range is removed.

From filter 215, the filtered RF carrier signal is coupled to a mixer 220 where it is combined with a locally generated frequency signal for removing the RF carrier signal and obtaining a baseband signal. This locally generated frequency signal is provided by a voltage controlled frequency generator 228. A commercially available voltage controlled oscillator manufactured by Murata and suitable for use as generator 228 is available as Part No. MQE001-776. The baseband signal that is outputted from the mixer 220 is coupled to a filter 222 which filters out all frequencies other than those in the base band signal. From the filter 222, the base band signal is coupled to an analog-to-digital (A/D) converter 225 where digital samples equivalent to the baseband signal are generated and coupled to a digital signal processor (DSP) 230. A digital signal processor suitable for use as digital signal processor 230 is available from Lucent Technologies as digital signal processor Model No. 2627. The functions for this digital signal processor, that are necessary for acquiring a carrier signal in a wireless receiver in accordance with the disclosed embodiment, are described in greater detail later herein with reference both to FIGS. 4 and 5.

Contained in the digital signal processor 230 are a frequency searcher/error estimator 231, a frequency error correction control voltage generator 232, a differential quaternary phase shift keying (DQPSK) demodulator 233, and a speech decoder 234. The estimator 231 searches for the carrier signal and, once located, determines the amount of offset frequency error of the local frequency generator and the direction to shift the frequency of the local frequency generator 228 in order to compensate for this offset frequency error. If the offset frequency error is too large, however, the frequency searcher/error estimator 231 will not be able to detect the carrier signal without first applying, in accordance with the disclosed embodiment, a carrier acquisition process described later herein. When the carrier signal is detected, a signal representative of the offset frequency error is outputted to the frequency error correction control voltage generator 232. At this generator, an error correction voltage is generated for ultimately adjusting the frequency of the local frequency generator 228.

An output signal from the frequency searcher/error estimator 231 is provided in a conventional manner to the DQPSK demodulator 233. In the DQPSK demodulator 233, the signal is demodulated and coupled to the speech decoder 234. The speech decoder 234 may be the decoder portion of a conventional coder-decoder (CODEC). The output from speech decoder 234 is coupled in a conventional manner through an audio circuits unit 250 to an acoustic sounder (not shown) in the portable unit for generating audible audio signals from the information modulated onto the RF carrier signal received by the antenna 201. It is to be understood that these audio signals also could be coupled to a modem interface such that signals suitable for inputting to, by way of example, a computer, facsimile or other terminal device may be obtained.

A correction voltage, generated at the control voltage generator 232, is coupled from the digital signal processor 230 to a digital-to-analog converter (D/A) 243. At this converter 243, the digital correction voltage is converted to an analog voltage before being coupled to a temperature compensated crystal oscillator (TCXO) 240. This crystal oscillator 240 provides a reference signal, typically 19.44 MHz, to a phase locked loop (PLL) 300. A commercially available temperature compensated crystal oscillator is available from Toyocom as Part No. TCO 986V and a commercially available phase locked loop suitable for use as the PLL 300 is available from National Semiconductor as Part No. LMX 2335MX.

Operably controlled by a microprocessor 270, the phase locked loop 300 provides a control voltage for stabilizing the local frequency generator 228. It is to be understood that the microprocessor 270 comprises the processing unit for the portable unit 20 and is also associated with or controls the functional components of the receiver circuit sections shown in FIG. 2. A microprocessor containing suitable memory and is usable as the microprocessor 270, in accordance with the teaching disclosed herein, is the Motorola HC 1611 microprocessor which is commercially available.

Referring next to FIG. 3, there is shown additional details of the phase locked loop 300 shown in FIG. 2. The reference signal of 19.44 MHz generated by the crystal oscillator 240 is reduced to 30 KHz by a reference divider 310 found in the phase locked loop 300. And a correction signal from the local frequency generator 228 is provided to a programmable divider 340, also located in the phase locked loop 300. This programmable divider 340, under the control of the microprocessor 270, reduces the frequency of the locally generated signal from the local frequency generator 228. If the local frequency generator is operating at the desired frequency, as determined by the microprocessor 270, then the signal output from the programmable divider 340 is a 30 KHz signal.

The signal from the reference divider 310 is compared with the signal from the programmable divider 340 in a phase comparator 320. If there is an error or difference in theses signals, there will be an offset correction voltage generated in the comparator 320 and provided to the generator 228. The generator 228, in turn, provides the correction signal to the programmable divider 340. The programmable divider continues to adjust its output, in response to this correction signal from the generator 228, until no difference in these signals is detected by the phase comparator 320. Once there is no error or difference in the signals from the dividers 310 and 340, no further offset correction voltage is provided to the generator 228 by the phase comparator 320.

With a highly stable temperature compensated crystal oscillator being used as the oscillator 240, any frequency shift will usually be within the capture range of the phase locked loop 300. However, the effects of variation and aging of other hardware circuits cannot be compensated for by just this oscillator circuit alone. Indeed, even the stability of the temperature compensated crystal oscillator will degrade over time. If the error from any of these sources is of such a magnitude that the amount of frequency shift required falls outside of the capture range of the phase locked loop 300, the receiver in the portable unit, without the carrier acquisition process described later herein, will not be able to acquire a carrier signal and the user of the portable telephone will not be able to obtain telephone service.

With reference now to FIGS. 2 and 3, in combination, there are two loops used in acquiring the carrier signal in the portable unit 20, an outer loop and an inner loop. The inner loop is defined by 1) the phase locked loop 300 which is operatively responsive to the microprocessor 270, 2) the local frequency generator 228, and 3) the temperature controlled crystal oscillator 240. The outer loop is defined by 1) the mixer 220, 2) the digital signal processor 230, and 3) those circuit sections within the inner loop. Before the outer loop is adjusted to a locked condition, the inner loop must have already been configured in such condition.

The frequency of the local frequency generator 228 is determined by the selected channel of operation for the portable unit. This operating channel will change as the portable unit 20 changes, for example, its frequency from the control channel to a traffic channel or from one traffic channel to another as the portable unit 20 changes its position relative to the base station 10. When a channel change is necessary, as determined by the microprocessor 270, this microprocessor 270 provides a frequency change signal to the programmable divider 340 in the phase locked loop 300, effectively changing the output frequency of this divider 340 to reflect a new desired operating channel. Thus the programmable divider 340, in this example, switches to and begin generating a frequency signal different from the 30 KHz signal. Since one of the frequencies to the phase comparator 320 at this time will not be at 30 KHz, an error voltage is generated by the phase comparator 320. This error voltage from the phase comparator 320 is coupled to the generator 228 and shifts the frequency of this generator 228 to the frequency of the desired operating channel. At the same time, a feedback signal from the generator 228 is coupled to the programmable divider 340 so that, as the frequency of the generator approaches the frequency of the operating channel, the output of the programmable divider 340 is similarly returned to 30 KHz. Thus, the inner loop is brought back into a locked condition and the phase locked loop 300 keeps the local frequency generator 228 on the selected channel of operation.

With reference next to the outer loop, which consists of the inner loop, the mixer 220 and also the digital signal processor 230, this outer loop attempts to adjust the signal generated by local frequency generator 228 so that this signal is exactly the same as the carrier signal provided to the mixer 220 from filter 215. Such operation is achieved in the following manner. Initially, the oscillator 240 may not be configured such that it operates exactly at 19.44 MHz. If not so configured, then the frequency from local frequency generator 228 will be different from the frequency of the carrier signal present at the output of filter 215. This off-set error condition will be detected by the estimator 231 which provides to the control voltage generator 232 an appropriate error signal equivalent to this difference in frequency. The control voltage generator 232 couples a control voltage to the oscillator 240 via the digital-to-analog converter 243. In the operation of the receiver in portable unit 20, as well as in a conventional receiver, when the error in the local frequency generator 228 is small enough, this outer loop will bring the frequency of the local frequency generator 228 to be exactly the same as the frequency of the carrier signal.

If the off-set error condition in oscillator 240 is at an increased level, such as may occur through aging of receiver components, for example, then the frequency of the carrier signal may fall outside of the normal search range of the digital signal processor 230 and the carrier signal possibly would not be found. Through a carrier signal acquisition process executed in the digital signal processor 230, in accordance with the disclosed embodiment, however, the carrier signal may be easily located when outside of the normal search range of the digital signal processor. Also, since large frequency errors can be easily corrected, a less accurate, low cost crystal oscillator may advantageously be employed in the receiver of the portable unit 10. Moreover, since the process needs to search only over a relatively narrow frequency band at any given time, a digital signal processor that requires a small number of instructions per second and minimal memory also may be employed in the receiver of the portable unit 10

The carrier signal acquisition process, in accordance with the disclosed embodiment is briefly described as follows. Whenever the digital signal processor 230, i.e., the estimator 231, is unable to find the carrier signal in its normal search range or frequency band, then the frequency of the oscillator 240 is intentionally offset to a different frequency by the digital signal processor 230 applying a predetermined level of control voltage. While the oscillator 240 is at this different frequency, a search for the carrier signal is made in a corresponding new search range or frequency band by the digital signal processor 230. If the carrier signal is then found, an attempt is made to capture this signal and lock on to it. If the carrier signal can not be found in this new search range, then the oscillator 240 is offset by a different predetermined level of control voltage and the digital signal processor 230 is configured to look for the carrier signal in yet another search range. This process is repeated until the carrier signal is found or a predetermined number of search ranges has been examined by the digital signal processor 230.

Figure 4:
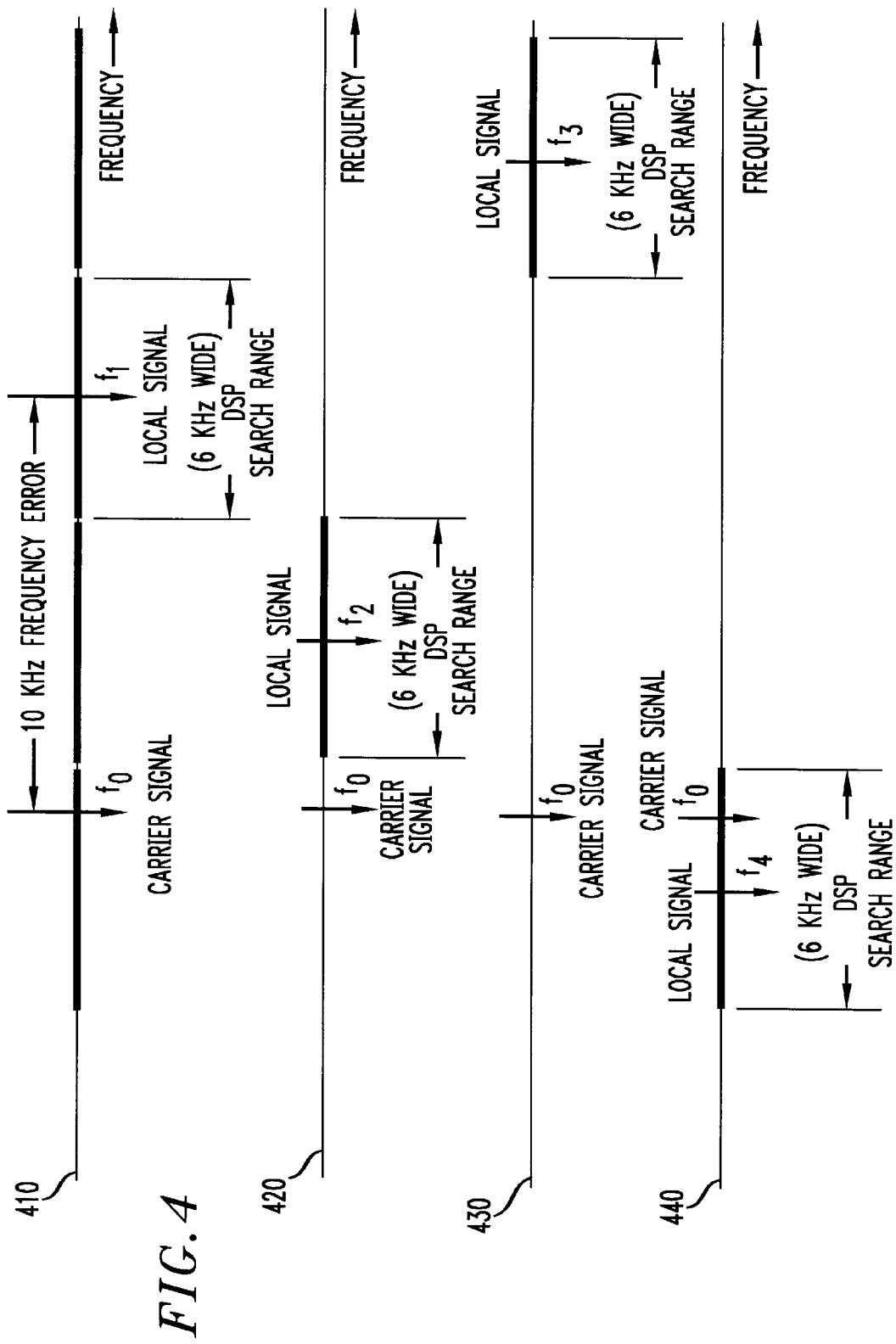
FIG. 4 is a timing diagram for illustrating the operation of the portable unit, in accordance with the invention.

With reference to FIG. 4, there is shown a timing diagram for illustrating in greater detail the operation of the digital signal processor 230 in searching for a carrier signal over a plurality of search ranges or frequency bands. In the operation of this example, it is assumed for illustrative purposes that the digital signal processor can acquire the carrier signal only when the local generator error is less than ±3 KHz; and that that the generator 228 has an error of 10 KHz. It is to be understood that such carrier signal acquisition range, although typical of the operation of many digital signal processors of today, is nevertheless not to be considered as limiting the operation of the invention to such frequency search range. Rather this carrier signal acquisition range is for illustrative purposes only and is being provided herein just for clarity in presenting the inventive aspects of the disclosed embodiment.

Four time lines, lines 410, 420, 430 and 440, are provided in FIG. 4. Each time line denotes a period in time during which the digital signal processor 230 searches in a designated frequency band or search range located within a predetermined frequency range for the carrier signal. Time line 420 occurs after time line 410 and time line 430 occurs after time line 420 and so forth. The data in each time line is gathered over a 20 millisecond period and analyzed in a 5 microsecond period by the digital signal processor 230. Thus, after essentially 80 milliseconds, the entire predetermined frequency range is searched for the carrier signal.

With reference first to time line 410, the frequency of the local generator is shown to be at point $f_1$ and the carrier signal from the base station 10 is shown to be at $f_0$. The digital signal processor 230 searches for the carrier signal when centered about frequency $f_1$. The distance between $f_0$ and $f_1$ is the frequency error which is illustratively shown as 10 KHz. As is apparent from an examination of time line 410, the digital signal processor 230 will not find the carrier signal since this signal is not in the range of ($f_1$−3 KHz) to ($f_1$+3 KHz) but, rather, is offset by the 10 KHz frequency error.

As shown by time line 420, the digital signal processor 230 introduces an intentional error of −6 KHz on the local frequency generator 228 by applying a first predetermined level of control voltage to the oscillator 240. This causes the frequency of the generator 228 to move to and become centered at frequency $f_2$. Next, the digital signal processor searches for the carrier signal in the range of $f_2$−3 KHz to $f_2$+3 KHz. Similarly to the operation shown in time line 410, the digital signal processor will not find the carrier signal in this search range.

In time line 430, the digital signal processor 230 introduces an intentional error of +12 KHz (2*6 KHz) into the local frequency generator 228 by applying a second predetermined level of control voltage to the frequency generator 240. This causes the frequency of the generator 228 to move to and become centered at frequency $f_3$. Next, the digital signal processor searches for the carrier signal in the range of $f_3$−3 KHz to $f_3$+3 KHz. Similarly to the operations shown in both time lines 410 and 420, the digital signal processor will not find the carrier signal in this search range.

Finally, in time line 440 the digital signal processor 230 introduces an intentional error of −18 KHz (3*6 KHz) on the local frequency generator 228 by applying a third predetermined level of control voltage to the frequency generator 240. This causes the frequency of the generator 228 to move to and become centered at frequency $f_4$. Next, the digital signal processor searches for the carrier signal in the range of $f_4-3$ KHz to $f_4+3$ KHz and finds the carrier signal at $f_4+2$ KHz. Once the carrier signal is found, additional control voltage is applied, as necessary, to bring the frequency of the generator 228 to $f_0$ which is, in this example, +2 KHz away from the center frequency $f_4$. At this point in time, in this example, the carrier signal has been successfully acquired by the portable unit 20.

Figure 5:
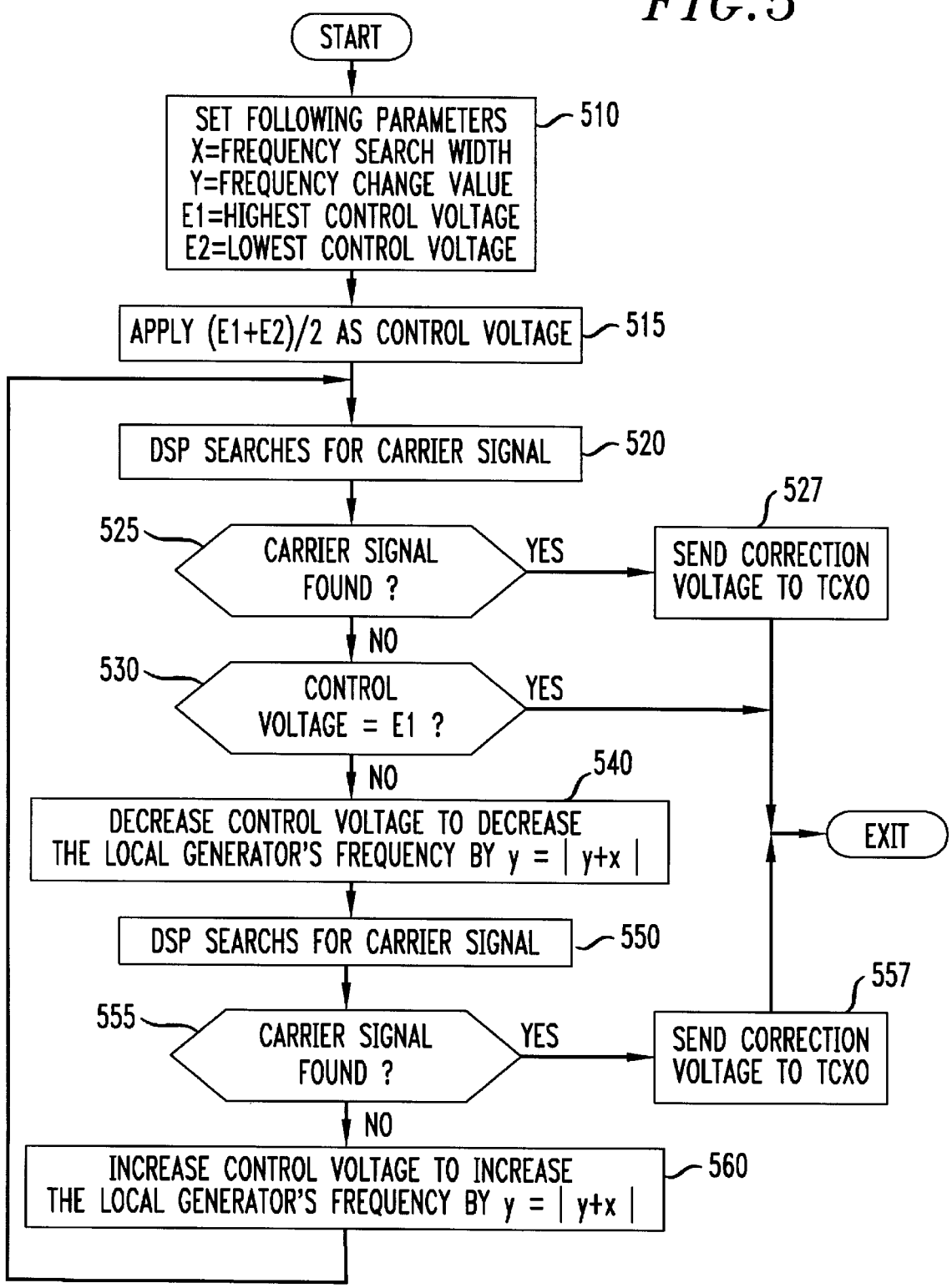
FIG. 5 is a flow diagram of a process suitable for incorporation into the portable unit for acquiring a carrier signal, in accordance with the invention.

Referring now to FIG. 5, there is shown a flow chart for illustrating the operation of the processor in executing a carrier acquisition operation. The functions provided by processor 230 are advantageously determined by a process or program stored in memory available in the microprocessor 270. The process is entered at step 410 where a number of parameters are initialized in the digital signal processor 230. The frequency search width is determined, the amount of the frequency change value for use in the carrier acquisition process is determined, also both the highest and lowest control voltages are determined. From the step 510 the process advances to step 515 where an average of the parameters which comprise the highest and lowest control voltages is applied to the oscillator 240. The frequency band or search range defined by the average of these two parameters is the one that has the highest probability of containing the carrier signal and is therefore searched first. From step 515 the process advances to step 520 where the digital signal processor 230 searches for the presence of the carrier signal in the signal received from the analog-to-digital converter 225.

From step 520 the process advances to decision 525 where a determination is made as to whether the carrier signal was found. If the carrier signal was found, the correction voltage is provided to the oscillator 240 and the process is exited. If the carrier signal was not found then the process advances to decision 530 where a determination is made as to whether the control voltage has reached its highest possible value or E1. If the control voltage is at the level E1, this reflects that the carrier signal cannot be found and the process is exited. If the control voltage has not reached the value E1 and also the carrier signal has not been found, the process advances to step 540 where the control voltage is decreased to decrease the local generator frequency by an amount $y=|y+x|$. The process next advances to step 550 where the digital signal processor 230 again searches for the carrier signal in the signal received from the analog-to digital converter 225.

From step 550 the process advances to the decision 555 where a determination is made as to whether the carrier signal was found. If the carrier signal was found, the correction voltage is provided to the oscillator 240 and the process is exited. If the carrier signal was not found then the process advances to step 560 where the control voltage is increased to increase the frequency of the local frequency generator by an amount equal to $y=|y+x|$. Then the process proceeds to step 520 where the digital signal processor 230 once again searches for the carrier signal. This process is repeated until either the carrier signal is located or the control voltage increases to the level E1, the value of the highest permitted control voltage level. Once the control voltage increase to the level E1, the process is exited.

Various other modifications of this invention are contemplated and may obviously be resorted to by those skilled in the art without departing from the spirit and scope of the invention as hereinafter defined by the appended claims.

We claim:

1. An apparatus for executing a carrier signal acquisition operation in a receiver of a wireless portable unit including carrier signal receiving circuitry, even when significant frequency offsets occur between the carrier signal and a local reference signal, the apparatus comprising:

a processor for examining a first designated frequency band within a predetermined frequency range in order to locate a carrier signal on a specific frequency channel, and sequentially examining at least one additional frequency band within a predetermined frequency range to locate said carrier signal on said specific frequency channel when said carrier signal is not located in said first designated frequency band, to thereby compensate for frequency differences between said carrier signal and said local reference signal;

a signal generator for providing said local reference signal; and signal capture means for locking the frequency of said local reference signal to the frequency of said carrier signal.

2. The apparatus as in claim 1 wherein said processor generates a plurality of predetermined levels of control voltages, each one of the plurality of predetermined levels of control voltages being usable by the processor for selecting a respectively associated one of a plurality of designated frequency bands.

3. The apparatus as in claim 2 wherein said processor provides each of said plurality of predetermined levels of control voltages for sequentially shifting the frequency of the local reference signal, said sequential shifting of the local reference signal enabling the processor to respectively examine each of the plurality of designated frequency bands.

4. The apparatus as in claim 3 wherein said first designated frequency band has the highest probability of containing said carrier signal.

5. The apparatus as in claim 1 wherein said processor includes a frequency searcher/error estimator for determining the amount of offset error between the frequency of the local reference signal and the frequency of the carrier signal.

6. The apparatus as in claim 5 wherein said processor further includes a frequency error correction control voltage generator operatively responsive to said frequency searcher/error estimator for generating a correction voltage for locking the frequency of said local reference signal to a frequency of the carrier signal.

7. The apparatus as in claim 6 wherein said signal capture means includes a crystal oscillator, said crystal oscillator being operatively responsive to said error correction control voltage generator for providing an offset reference signal for use by said signal generator.

8. The apparatus as in claim 7 further including a phase locked loop operably connected to said crystal oscillator for coupling said offset reference signal from the oscillator to the signal generator, said offset reference signal adjusting the local reference frequency from said signal generator to be the same as the frequency of said carrier signal.

9. The apparatus as in claim 1 wherein, when said carrier signal is not located in said first designated frequency band, the processor next examines a second frequency band positioned adjacent to said first designated frequency band for locating said carrier signal.

10. The apparatus as in claim 9 wherein the processor examines a predetermined third frequency band within the predetermined frequency range when the carrier signal is not located in said second frequency band, said third frequency band being positioned adjacent to said first frequency band on the side opposite to that of said second frequency band.

11. The apparatus as in claim 1 wherein:

said processor has a limited search range such that said processor cannot reliably locate said carrier signal when the frequency of said carrier signal is not within a limited range of said local reference signal; and said processor adjusts the frequency of said local reference signal when said carrier signal is not located in said first designated frequency band to enable said processor to examine said at least one additional designated frequency band.

12. The apparatus as in claim 11 wherein:

said signal capture means includes a crystal oscillator for generating a reference oscillating signal;

said signal capture means further includes a phase locked loop for receiving said reference oscillating signal and said local reference signal, and outputting an offset reference signal to said signal generator to adjust the frequency of said local reference signal in accordance with the frequency of said reference oscillating signal; and said processor outputs control voltages to said crystal oscillator when said carrier signal is not located in said first designated frequency band to change the frequency of said reference oscillating signal so that the offset reference signal output by said phase locked loop adjusts the frequency of said local reference signal to a frequency in said at least one additional frequency band.

13. A method of executing a carrier signal acquisition operation in a receiver of a wireless portable unit including carrier signal receiving circuitry, even when significant frequency offsets occur between the carrier signal and a local reference signal, the method comprising:

examining a first designated frequency band within a predetermined frequency range in order to locate a carrier signal on a specific frequency channel, and sequentially examining at least one additional frequency band within a predetermined frequency range to locate said carrier signal on said specific frequency channel when said carrier signal is not located in said first designated frequency band, to thereby compensate for frequency differences between said carrier signal and said local reference signal;

generating sad local reference signal; and locking the frequency of said local reference signal to the frequency of said carrier signal.

14. The method of claim 13 further including the step of generating a plurality of predetermined levels of control voltages, each one of the plurality of predetermined levels of control voltages being usable for selecting a respectively associated one of a plurality of designated frequency bands.

15. The method of claim 14 further including:

providing each of said plurality of predetermined levels of control voltages for sequentially shifting the frequency of the local reference signal, said sequential shifting of the local reference signal permitting examination of each of the plurality of designated frequency bands.

16. The method of claim 15 wherein said first designated frequency band has the highest probability of containing said carrier signal.

17. The method of claim 13 wherein, when said carrier signal is not located in said first designated frequency band, a second frequency band positioned adjacent to said first designated frequency band is examined for locating said carrier signal.

18. The apparatus as in claim 17 including the step of examining a predetermined third frequency band within the predetermined frequency range when the carrier signal is not located in said second frequency band, said third frequency band being positioned adjacent to said first frequency band on the side opposite to that of said second frequency band.

19. The method as in claim 13 wherein:

said examining step has a limited search range such that said carrier signal cannot be reliably located when the frequency of said carrier signal is not within a limited frequency range of said local reference signal; and said examining step adjusts the frequency of said local reference signal when said carrier signal is not located in said first designated frequency band to enable examination of said at least one additional designated frequency band.

20. The method as in claim 19 wherein:

said locking step generates a reference oscillating signal, compares said reference oscillating signal to said local reference signal, and adjusts the frequency of said local reference signal based on the comparison results; and said examining step adjusts the frequency of said local reference signal by changing the frequency of said reference oscillating signal to enable examination of said at least one additional designated frequency band.

21. An apparatus for executing a carrier signal acquisition operation in a receiver, even when significant frequency offsets occur between the carrier signal and a local reference signal, comprising:

a processor for sequentially examining a plurality of designated frequency bands within a predetermined frequency range for locating a carrier signal on a specific frequency channel, to thereby compensate for frequency differences between said carrier signal and said local reference signal, the processor examining a predetermined first frequency band within the predetermined frequency range and if said carrier signal on said specific frequency channel is not located in this first frequency band, the processor next examining a second frequency band positioned adjacent to said first frequency band for locating said carrier signal on said specific frequency channel, when said carrier signal is not located in said second frequency band, the processor next examining a predetermined third frequency band within the predetermined frequency range, said third frequency band being positioned adjacent to said first frequency band on the side opposite to that of said second frequency band; and a signal generator for generating said reference signal; wherein said processor generates a plurality of predetermined levels of control voltages, for selecting a respectively associated one of the plurality of designated frequency bands, and outputs each of said plurality of predetermined levels of control voltages for sequentially shifting the frequency of the reference signal generated by the signal generator to enable the processor to respectively examine each of the plurality of designated frequency bands.

22. The apparatus as in claim 21 wherein said first predetermined frequency band examined by the processor has the highest probability of containing the carrier signal.

23. The apparatus as in claim 18 wherein:

said processor has a limited search range such that said processor cannot reliably locate said carrier signal when the frequency of said carrier signal is not within a limited frequency range of said local reference signal; and said processor adjusts the frequency of said local reference signal when said carrier signal is not located in said first designated frequency band to enable said processor to examine said at least one additional designated frequency band.

24. The apparatus as in claim 23, further comprising:

signal capture means for locking the frequency of said local reference signal to the frequency of said carrier signal.

25. The apparatus as in claim 24 wherein:

said signal capture means includes a crystal oscillator for generating a reference oscillating signal;

said signal capture means further includes a phase locked loop for receiving said reference oscillating signal and said local reference signal, and outputting an offset reference signal to said signal generator to adjust the frequency of said local reference signal in accordance with the relative frequencies of said reference oscillating signal and said local reference signal; and said processor outputs control voltages to said crystal oscillator when said carrier signal is not located in said first designated frequency band to change the frequency of said reference oscillating signal so that the offset reference signal output by said phase locked loop adjusts the frequency of said local reference signal to a frequency in a second designated frequency band.

* * * * *